United States Patent
Hung

(10) Patent No.: US 7,863,812 B2
(45) Date of Patent: Jan. 4, 2011

(54) EMISSION LAYER AND ORGANIC LIGHT EMITTING DIODE USING THE SAME

(75) Inventor: Min-Ling Hung, Pingtung County (TW)

(73) Assignee: Au Optronics Corp., Hsin-Chu (TW)

( * ) Notice: Subject to any disclaimer, the term of this patent is extended or adjusted under 35 U.S.C. 154(b) by 130 days.

(21) Appl. No.: 12/149,773

(22) Filed: May 8, 2008

(65) Prior Publication Data

US 2008/0238309 A1    Oct. 2, 2008

Related U.S. Application Data

(62) Division of application No. 11/241,952, filed on Oct. 4, 2005, now abandoned.

(30) Foreign Application Priority Data

May 25, 2005    (TW) .............................. 94117135 A

(51) Int. Cl.
H01J 1/62        (2006.01)
(52) U.S. Cl. ...................... 313/504; 313/506
(58) Field of Classification Search ................. 313/504, 313/506
See application file for complete search history.

(56) References Cited

U.S. PATENT DOCUMENTS

| | | |
|---|---|---|
| 5,503,910 A | 4/1996 | Matsuura et al. |
| 5,683,823 A | 11/1997 | Shi et al. |
| 5,779,937 A | 7/1998 | Sano et al. |
| 5,972,247 A | 10/1999 | Shi et al. |
| 6,203,933 B1 | 3/2001 | Nakaya et al. |
| 6,627,333 B2 | 9/2003 | Hatwar |
| 6,641,933 B1 | 11/2003 | Yamazaki et al. |
| 6,690,109 B2 | 2/2004 | Tada |
| 6,696,703 B2 | 2/2004 | Mueller-Mach et al. |
| 7,238,436 B2 | 7/2007 | Hatwar et al. |
| 2002/0127427 A1 | 9/2002 | Young et al. |
| 2003/0067008 A1 | 4/2003 | Srivastava et al. |
| 2004/0033388 A1 | 2/2004 | Kim et al. |
| 2004/0247937 A1 | 12/2004 | Chen et al. |
| 2005/0089714 A1 | 4/2005 | Hatwar et al. |
| 2005/0112404 A1* | 5/2005 | Hamada et al. .............. 428/690 |
| 2005/0123794 A1 | 6/2005 | Deaton et al. |
| 2006/0024525 A1 | 2/2006 | Jeong et al. |
| 2006/0115681 A1 | 6/2006 | Kambe et al. |
| 2007/0057885 A1 | 3/2007 | Kurumisawa et al. |

FOREIGN PATENT DOCUMENTS

| | | |
|---|---|---|
| CN | 1585580 | 2/2005 |
| TW | 593630 | 6/2004 |
| TW | 224473 | 11/2004 |
| WO | WO 2005043640 | 5/2005 |

* cited by examiner

*Primary Examiner*—Vip Patel
(74) *Attorney, Agent, or Firm*—Bacon & Thomas, PLLC

(57) ABSTRACT

An emission layer of an organic light emitting diode (OLED) for emitting a white light includes a host material, a first luminescent dopant, and a second luminescent dopant. The host material has a peak emission wavelength of about 300 nm to about 530 nm. The first luminescent dopant has a peak emission wavelength of about 300 nm to about 530 nm. The second luminescent dopant has a peak emission wavelength of about 530 nm to about 720 nm.

9 Claims, 3 Drawing Sheets

EMISSION LAYER AND ORGANIC LIGHT EMITTING DIODE USING THE SAME

This application is a divisional application of co-pending application Ser. No. 11/241,952, filed on Oct. 4, 2005, and claims the benefit of Taiwan Application Serial No. 094117135, filed May 25, 2005, the subject matter of which is incorporated herein by reference.

BACKGROUND OF THE INVENTION

1. Field of the Invention

The invention relates in general to an emission layer and an organic light emitting diode using thereof, and more particularly to an emission layer and an organic light emitting diode using thereof for emitting a white light.

2. Description of the Related Art

A conventional organic light emitting diode (OLED) is a multi-layer structure including a substrate, an anode, a hole-transport layer, an emission layer, an electron-transport layer, and a cathode. The anode, the hole-transport layer, the emission layer, the electron-transport layer, and the cathode are disposed on the substrate orderly from bottom to top. The emission layer includes a host-dopant system, in which a few dopants are doped in host material.

When a voltage is applied to the cathode and the anode, electrons are injected into the emission layer from the cathode through the electron-transport layer. Holes are injected into the emission layer from the anode and through the hole-transport layer. After the electrons and the holes combine in the emission layer, the host material is excited from a stable state to an excited state. Because the host material in the excited state is unstable, the host material certainly returns to the stable state and transfer energy to the dopants.

When the dopants receiving the energy are excited from the stable state to the excited state, singlet excitons and triplet excitons are generated by the dopants. Due to the distribution ratio of the electron spin state, the probability of forming the triplet excitons and the singlet excitons is approximately 3:1. Electroluminescence occurs in the OLED while the singlet excitons or the triplet excitons return to the stable state by releasing photons.

Combined by two or three light-emitting materials that generate lights of different wavelength, the emission layer emits white light. For example, in addition to blue, green, and red light-emitting materials, there is also a combination of blue-green, yellow and orange light-emitting materials in order to formulate white-light emitting diode. Further, the OLED can emit white light by emitting a combination of two colors, such as blue-green light and red light or a combination of blue light and orange light. The conventional emission layer is classified into three kinds by its structure. The first kind of the emission layer has three sublayers relatively comprising red, green, and blue light emitting material doped in the host material. Each sublayers emits red, green or blue light in order to formulate white light diode. The second kind of the emission layer has two sublayers relatively comprising blue and red light emitting material doped in the host material. The third kind of the emission layer has only one layer comprising yellow or red light emitting material doped in the blue host material.

However, the emission layer with two or three sublayers provides high luminance efficiencies combined with high color purity and long lifetimes, but the process for manufacturing is too complicated. On the other hand, the single one emission layer is rather easy to manufacture, but provides low luminance efficiency and poor color purity. Notwithstanding these developments, there are continuing needs for OLED components, such as light-emitting materials, sometimes referred to as dopants, that will provide high luminance efficiencies combined with high color purity and long lifetimes and simplified manufacture process.

SUMMARY OF THE INVENTION

In view of the foregoing, it is an object of the present invention to provide an emission layer and an organic light emitting diode using thereof capable of emitting a white light with high luminance efficiency and color purity. The emission layer is single layer structure comprising blue-to-green host material and red-to-yellow dopant in specified proportion thereto. (Further, the emission layer comprises another dopant having a peak emission range from blue to green-blue in order to raise the luminance efficiency.)

The invention achieves the above-identified object by providing an emission layer of an organic light emitting diode (OLED) for emitting a white light. The emission layer includes a host material, a first luminescent dopant, and a second luminescent dopant. The host material has a peak emission wavelength of about 300 nm to about 530 nm for emitting blue-to-green light. The first luminescent dopant has a peak emission wavelength of about 300 nm to about 530 nm for emitting blue-to-green light. The second luminescent dopant has a peak emission wavelength of about 530 nm to about 720 nm for emitting red-to-yellow light.

It is object of the invention to providing another emission layer of an organic light emitting diode (OLED) for emitting a white light. The emission layer includes a host material and a luminescent dopant. The host material has a peak emission wavelength of about 300 nm to about 530 nm for emitting blue-to-green light. The luminescent dopant has a peak emission wavelength of about 530 nm to about 720 nm for emitting red-to-yellow light. The doped ratio of the luminescent dopant to the host material is substantially between about 0.01 and 5 percent by volume.

It is object of the invention to provide an organic light emitting diode (OLED) display panel. The OLED display panel includes a first substrate assembly, a second substrate assembly, and an adhesive formed therebetween. The first substrate assembly includes a first substrate, an anode and a relative cathode, an emission layer, an electron-transport layer, and a hole-transport layer. The cathode and the anode are positioned relatively above the first substrate. The emission layer is disposed between the cathode and the anode for emitting white light. The emission layer includes a host material and a luminescent dopant. The host material has a peak emission wavelength of about 300 nm to about 530 nm for emitting blue-to-green light. The luminescent dopant has a peak emission wavelength of about 530 nm to about 720 nm for emitting red-to-yellow light. The doped proportion of the luminescent dopant is about 0.01% to about 5%. The hole-transport layer is disposed between the emission layer and the anode. The electron-transport layer is disposed between the emission layer and the cathode. The second substrate assembly comprises at least one second substrate relative to the first substrate assembly. The adhesive is disposed between the first substrate and the second substrate.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
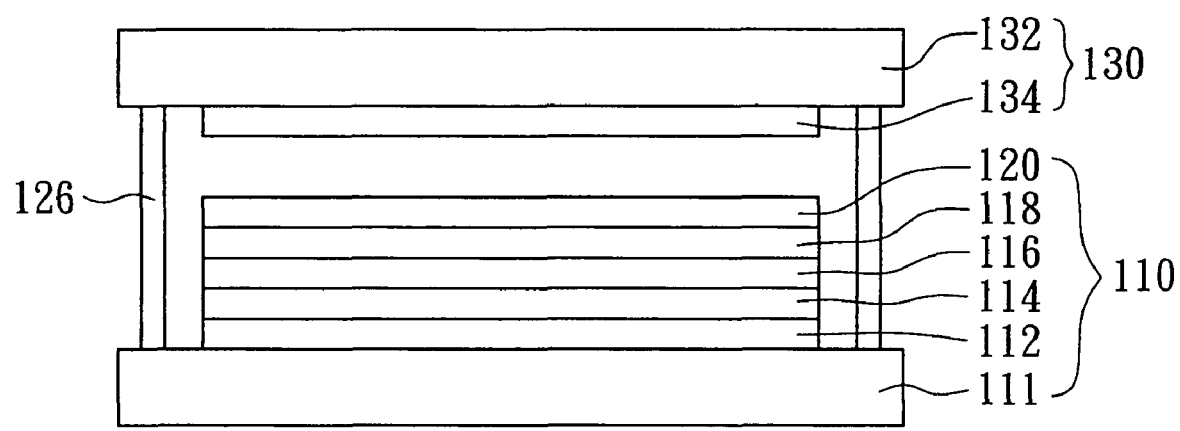
FIG. 1 is as diagram of an OLED display panel according to the preferred embodiment of the invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

It is an object of the present invention to provide an emission layer and an organic light emitting diode using thereof capable of emitting a white light with high luminance efficiency and color purity. The emission layer is single one layer structure comprising blue-to-green host material and red-to-yellow dopant in specified proportion thereto. Further, the emission layer comprises another dopant having a peak emission range from blue to green-blue in order to raise the luminance efficiency.

The emission layer of the organic light emitting diode of the invention is used for emitting a white light. The emission layer can contain a single pure material with a high luminescent efficiency. The emission layer can also contain lesser amounts of other materials, as so called dopants, whose function in this structure is to alter the OLED efficiency or the color of the emitted light. The emission layer of one embodiment according to the invention comprises a host material and a luminescent dopant. The host material has a peak emission wavelength of about 300 nanometers (nm) to about 530 nm, preferably of about 360 nm to about 480 nm. The luminescent dopant has a peak emission wavelength of about 530 to about 720 nm, preferably of about 530 nm to about 700 nm. The host material, emitting blue or blue-green light, and the luminescent dopant, emitting red or yellow light, are formulated to white light. The quantity of the dopant in an emission layer, relative to the host material, is usually between about 0.01% and 5% and preferably between about 0.1% and 5%. Hereinafter, in describing the composition of a mixed material, a percentage refers to a percentage by volume.

The absolute value of the highest occupied molecular orbital (HOMO) of the luminescent dopant is less than or equal to that of the host material. The absolute value of the lowest unoccupied molecular orbital (LUMO) of the luminescent dopant is more than or equal to that of the host material.

Each of the host material and the luminescent dopant has a molecular weight less than about 1000. For example, the host material comprises 2-methyl-9,10-di(2-naphthyl)anthracene (MADN), and the luminescent dopant comprises 4-(dicyanomethylene)-2-t-butyl-6-(1,1,7,7-tetramethyl-julolidyl-9-enyl)-4H-pyran) (DCJTB) or derivatives of perylene. The structure of MADN and DCJTB are shown below.

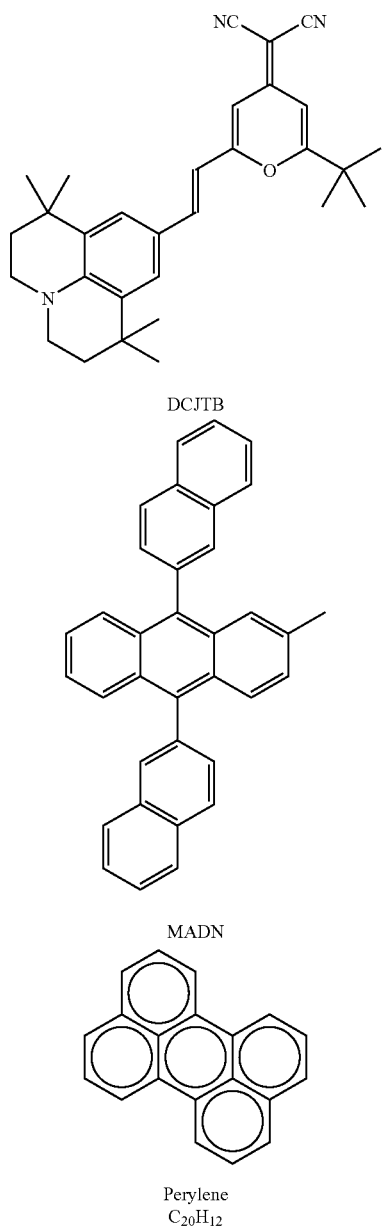

DCJTB

MADN

Perylene
$C_{20}H_{12}$

On the other hand, the emission layer of another embodiment comprises a first luminescent dopant and a second luminescent dopant. The first luminescent dopant has a peak emission wavelength of about 300 nm to about 530 nm, preferably of about 360 to about 480 nm. The quantity of the first luminescent dopant in an emission layer, relative to the host material, is usually between 0.01% and 50% and preferably between 0.01% and 20%. The first luminescent dopant and the host material have emission peaks of substantially the same wavelength, and emit blue to blue-green light. The first luminescent dopant increases the blue luminance efficiency, improving the white luminance efficiency. The second luminescent dopant has a peak emission wavelength of about 530 nm to about 720 nm, preferably of about 530 nm to about 700 nm, to emit red to yellow light.

The absolute value of HOMO of the first luminescent dopant is more than or equal to that of the second luminescent dopant. The absolute value of LUMO of the first luminescent dopant is less than or equal to that of the second luminescent dopant.

Moreover, the molecular weight of each of the first and second luminescent dopant is less than about 1000. Preferably, the molecular weight of each of the host material, and the first and second luminescent dopant are less than about 1000.

The emission layer of the invention can be applied to an organic light emitting diode (OLED) display panel. Referring to FIG. 1, which is as diagram of an OLED display panel according to the preferred embodiment of the invention. The OLED display panel 100 of the preferred embodiment includes a first substrate assembly 110, a second substrate assembly 130, and an adhesive 126. The first substrate assembly 110 includes a first substrate 111, an anode 112 and a relative cathode 120, an emission layer 116, a hole-transport layer 114, and an electron-transport layer 118. The anode 112 and the cathode 120 are disposed relatively above the first substrate 111. For example, the anode 112, such as indium tin oxide (ITO), is disposed on the first substrate 111, and a multi-layer structure is sandwiched between the anode 112 and cathode 120, disposed relatively above the anode 112. In a variant of this structure, the cathode, rather than the anode, rests upon the substrate. Detailedly, the emission layer 116, disposed between the anode 112 and the cathode 120, at least comprises a host material and a luminescent dopant. The host material has a peak emission wavelength of about 300 nm to about 530 nm, and the luminescent dopant has a peak emission wavelength of about 530 to about 720 nm. The quantity of the luminescent dopant in an emission layer, relative to the host material, is usually between 0.01% and 5% and preferably between 0.1% and 5%. The hole-transport layer 114 is disposed on the anode 112, and positioned between the emission layer 116 and the anode 112. The electron-transport layer 118 is disposed on the emission layer 116, and positioned between the emission layer 116 and the cathode 120. The second substrate assembly 130 at least comprises a second substrate 130, disposed relatively to the first substrate assembly 110. The adhesive 126 is disposed between the first substrate 111 and the second substrate The emission layer preferably comprises a first and second luminescent dopants. The first luminescent dopant has a peak emission wavelength of about 300 nm to about 530 nm, and the quantity of the first luminescent dopant in an emission layer, relative to the host material, is usually between 0.01% and 50% and preferably between 0.1% and 20%. The first luminescent dopant and the host material have emission peaks of substantially the same wavelength, to emit blue to blue-green light. The first luminescent dopant increases the blue luminance efficiency, improving the white luminance efficiency. The second luminescent dopant has a peak emission wavelength of about 530 nm to about 720 nm, and preferably of about 530 nm to about 700 nm, to emit red-to-yellow light. The absolute value of HOMO of the second luminescent dopant is less than or equal to that of the first luminescent dopant. The absolute value of LUMO of the second luminescent dopant is more than or equal to that of the first luminescent dopant. The absolute value of HOMO of the host material is more than or equal to that of the hole-transport layer. The absolute value of LUMO of the host material is less than or equal to that of the electron-transport layer.

When the cathode 112 and the anode 120 are connected to a source of electrical current (not shown), holes are injected form the anode and electrons are injected from the cathode, and they recombine in the emission layer. Afterward, the host material is excited from a stable state to an unstable excited state, so that the host material certainly returns to the stable state and transfer energy to the dopants.

When the dopants receiving the energy are excited from the stable state to the excited state, singlet excitons and triplet excitons are generated by the dopants. Due to the distribution ratio of the electron spin state, the probability of forming the triplet excitons and the singlet excitons is approximately 3:1. Electroluminescent light produces while the singlet excitons or the triplet excitons return to the stable state by releasing photons.

The second substrate assembly further includes a color filter 134, disposed on the second substrate 132. The white light emitted from the emission layer 116 goes through the color filter 134 to be viewed as many color spots, constituting a colorful image.

Herein, several experimental results are provided to elucidate the characteristics of the OLED display panel according to the present invention. In the tests below, the emission layer includes MADN, as the host material, doped with 8% of perylene and 0.1% of DCJTB. There, the following additional layers were formed in sequence: ITO as the anode, NPB as hole-transport layer, MADN doped with 8% of perylene and 0.1% of DCJTB as emission layer, Alq as electron-transport layer, LiF/Al as the cathode. The above sequence completed the construction of the OLED.

Experiment One—Luminance Efficiency

Figure 2:
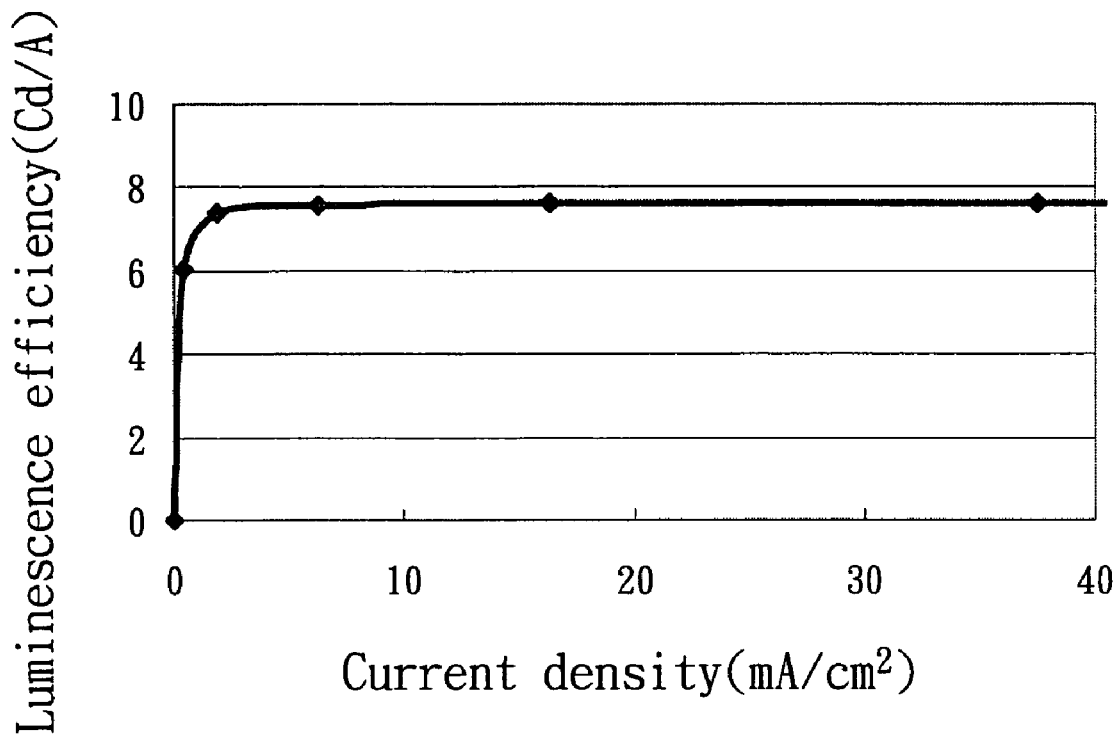
FIG. 2 is a diagram illustrating the relationship between the current density and the luminescence efficiency according to the preferred embodiment of the invention.

After applying electrical current to the anode and the cathode, the luminescence was detected to evaluate the luminance efficiency. FIG. 2 is a diagram illustrating the relationship between the current density and the luminescence efficiency according to the preferred embodiment of the invention. The luminescence efficiency of the emission layer according to the embodiment is 7.9 cd/A, that is, the OLED of the embodiment transfers electrical current to luminescent well.

Experiment Two—Chromaticity Test

Figure 3A:
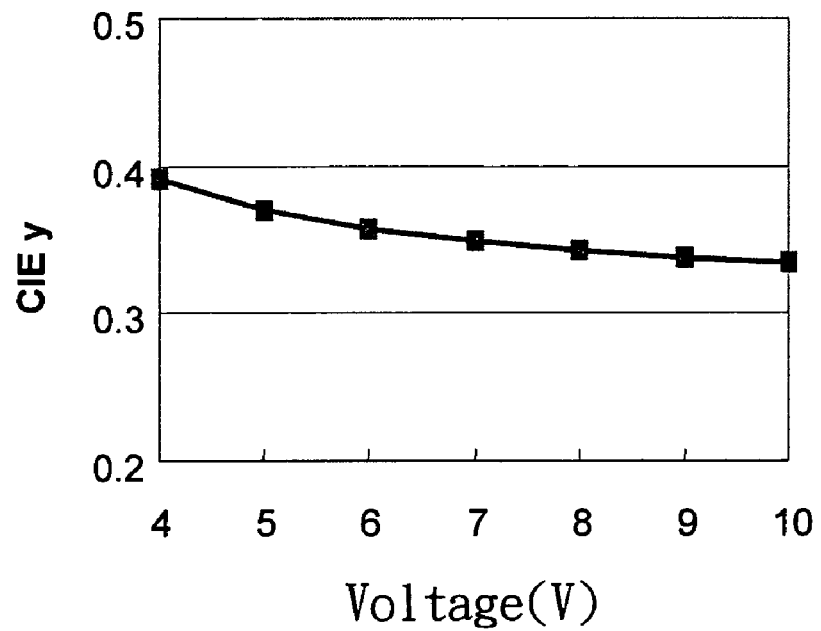
FIG. 3A is a diagram illustrating the relationship between the voltage and the $CIE_x$ according to the preferred embodiment of the invention.
Figure 3B:
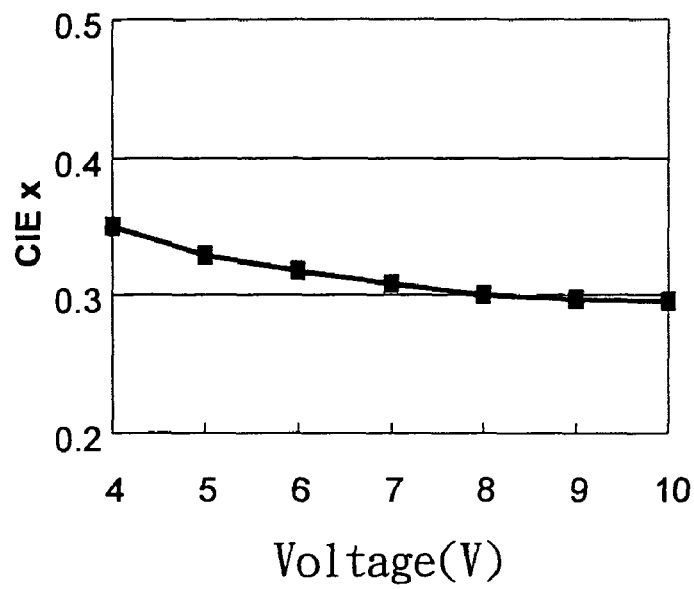
FIG. 3B is a diagram illustrating the relationship between the voltage and the $CIE_y$ according to the preferred embodiment of the invention.

After applying electrical current to the anode and the cathode, the CIE coordinates $CIE_x$ and $CIE_y$ was measured by a photometer. FIG. 3A is a diagram illustrating the relationship between the voltage and the $CIE_x$ according to the preferred embodiment of the invention, and FIG. 3B is a diagram illustrating the relationship between the voltage and the $CIE_y$ according to the preferred embodiment of the invention. Referring to FIGS. 3A and 3B, $CIE_x$ and $CIE_y$ corresponding to the chromaticity diagram created by Commission Internationale de l'Eclairage (CIE) are proven that the emission layer emits pure white light.

Experiment Three—Stability Test

Figure 4:
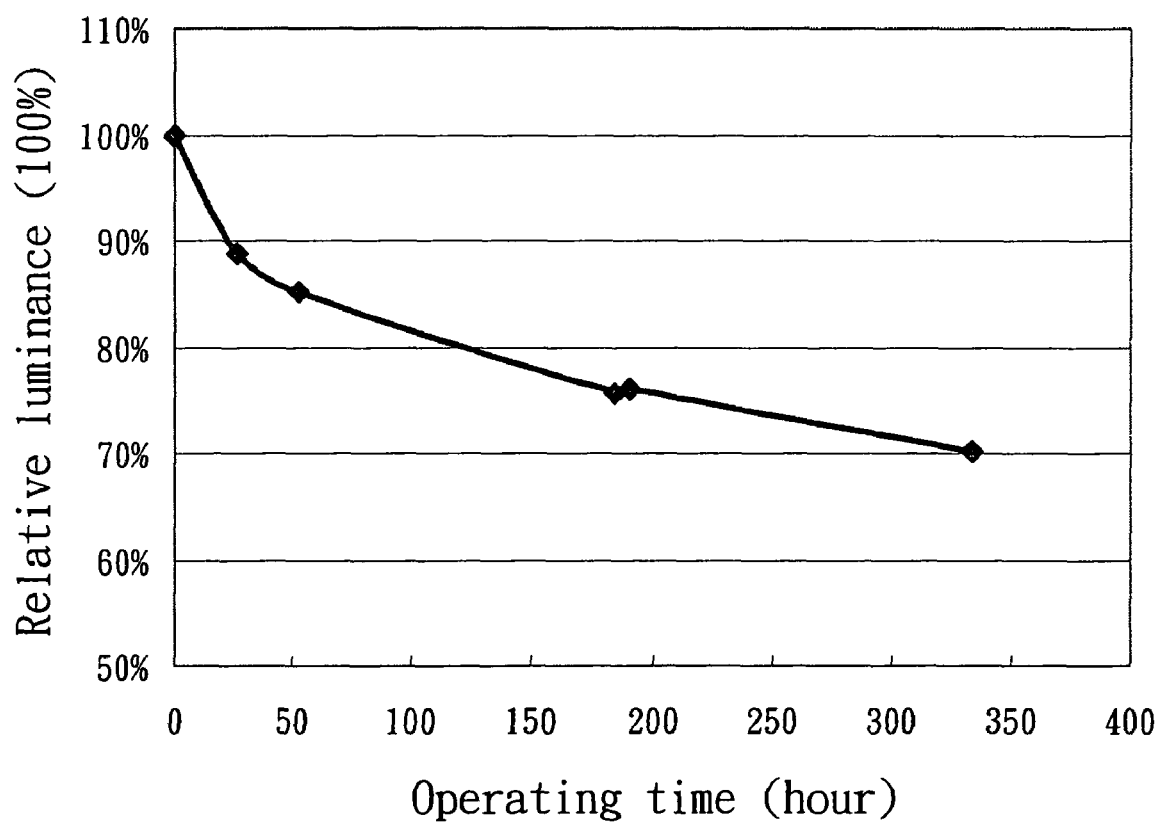
FIG. 4 is a diagram showing the luminance, relative to its initial value, as a function of operating time.

The operating stability of this OLED was evaluated by monitoring its luminance while operating it by a constant driving voltage. The initial luminance is 3000 nits, and the luminance, relative to its initial value, is shown as a function of operating time in FIG. 4. The luminance of this OLED still remains 70% of its initial value after 333 hours of operation. Therefore, the OLED of the embodiment is so stable that owns a longer utilizing life.

As described hereinbefore, the emission layer and the OLED using thereof has many advantages. The emission layer is single one layer structure comprising blue-to-green host material and red-to-yellow dopant in specified proportion thereto to emit white light. Further, the emission layer comprises another dopant having a peak emission range from blue to green-blue in order to increase blue light and raise the luminance efficiency. Besides, the operating stability of the OLED according to the invention can be improved, so that the OLED owns an elongating utilizing life.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An organic light emitting diode (OLED) comprising:
an electron-transport layer;
a hole-transport layer opposed to the electron-transport layer; and
an emission layer disposed between the electron-transport layer and the hole-transport layer, the emission layer comprising:
a host material, comprising 2-methyl-9,10-di(2-naphthyl) anthracene (MADN);
a first luminescent dopant for emitting blue light, the first luminescent dopant comprising perylene; and
a second luminescent dopant for emitting red or yellow light, the second luminescent dopant comprising 4-(dicyanomethylene)-2-t-butyl-6-(1,1,7,7-tetramethyl-julolidyl-9-enyl)-4H-pyran) (DCJTB);
wherein an absolute value of the highest occupied molecular orbital (HOMO) of the first luminescent dopant is less than or equal to that of the host material, and an absolute value of the lowest unoccupied molecular orbital (LUMO) of the first luminescent dopant is more than or equal to that of the host material.

2. The OLED according to claim 1, wherein an absolute value of the HOMO of the second luminescent dopant is less than or equal to that of the first luminescent dopant, and an absolute value of the LUMO of the second luminescent dopant is more than or equal to that of the first luminescent dopant.

3. The OLED according to claim 1, wherein the absolute value of the HOMO of the host material is more than or equal to that of the hole-transport layer, and the absolute value of the LUMO of the host material is less than or equal to that of the electron-transport layer.

4. The OLED according to claim 1, wherein the doped ratio of the first luminescent dopant to the host material is substantially between 0.01 and 50 percent by volume.

5. The OLED according to claim 4, wherein the doped ratio of the second luminescent dopant to the host material is substantially between 0.01 and 5 percent by volume.

6. The OLED according to claim 4, wherein the doped ratio of the second luminescent dopant to the host material is substantially between 0.1 and 5 percent by volume.

7. The OLED according to claim 4, wherein the doped ratio of the first luminescent dopant to the host material is substantially between 0.01 and 20 percent by volume.

8. The OLED according to claim 1, wherein the doped ratio of the second luminescent dopant to the host material is substantially between 0.1 and 5 percent by volume.

9. The OLED according to claim 1, wherein the MADN host material is doped with 8% of perylene and 0.1% of DCJTB, the hole-transport layer is NPB, Alq is the electron-transport layer and said OLED further comprises an ITO anode below the hole-transport layer and a LiF/Al cathode above the electron-transport layer.

* * * * *